United States Patent
Ohtani et al.

(10) Patent No.: US 10,319,757 B2
(45) Date of Patent: Jun. 11, 2019

(54) PHOTOELECTRIC CONVERSION DEVICE AND IMAGING SYSTEM

(71) Applicant: CANON KABUSHIKI KAISHA, Tokyo (JP)

(72) Inventors: Akira Ohtani, Ebina (JP); Tasuku Kaneda, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/683,660

(22) Filed: Aug. 22, 2017

(65) Prior Publication Data
US 2018/0061872 A1    Mar. 1, 2018

(30) Foreign Application Priority Data

Aug. 29, 2016  (JP) .................... 2016-167346

(51) Int. Cl.
| | | |
|---|---|---|
| *H01L 27/14* | (2006.01) | |
| *H01L 27/146* | (2006.01) | |
| *H04N 5/232* | (2006.01) | |
| *H04N 5/361* | (2011.01) | |
| *H04N 5/374* | (2011.01) | |

(52) U.S. Cl.
CPC ..... *H01L 27/1461* (2013.01); *H04N 5/23293* (2013.01); *H04N 5/361* (2013.01); *H04N 5/374* (2013.01)

(58) Field of Classification Search
CPC .......... H01L 27/1461; H04N 5/23293; H04N 5/361; H04N 5/374
See application file for complete search history.

(56) References Cited

U.S. PATENT DOCUMENTS

| | | | | |
|---|---|---|---|---|
| 2004/0135922 A1* | 7/2004 | Nakajima | ............ | H04N 5/361 348/362 |
| 2005/0127415 A1* | 6/2005 | Yuzurihara | ....... | H01L 27/14603 257/292 |
| 2006/0194132 A1* | 8/2006 | Hosoi | ............ | G03G 5/08221 430/56 |
| 2007/0257248 A1* | 11/2007 | Arao | .............. | G01J 1/44 257/10 |

(Continued)

FOREIGN PATENT DOCUMENTS

| | | |
|---|---|---|
| JP | 3423102 B2 | 7/2003 |
| JP | 2007-251074 A | 9/2007 |

(Continued)

*Primary Examiner* — Charles D Garber
*Assistant Examiner* — S. M. S Imtiaz
(74) *Attorney, Agent, or Firm* — Canon U.S.A. Inc., IP Division

(57) ABSTRACT

A photoelectric conversion device includes a photoelectric conversion portion in a silicon layer having a light-receiving surface. The silicon layer includes a P-type impurity region including a base portion having an atomic boron concentration Ba that is the highest of the portions opposite the light-receiving surface with respect to a charge accumulation region and an atomic oxygen concentration Oa, and a deep portion located opposite the charge accumulation region in the depth direction with respect to the base portion and having an atomic boron concentration Bb and an atomic oxygen concentration Ob. The impurity region satisfies $Ba \times Oa^2 < Bb \times Ob^2$.

18 Claims, 6 Drawing Sheets

(56) References Cited

U.S. PATENT DOCUMENTS

| | | | | |
|---|---|---|---|---|
| 2014/0246707 A1* | 9/2014 | Koo | ............... | H01L 27/14614 |
| | | | | 257/230 |
| 2015/0130009 A1* | 5/2015 | Eikyu | ............... | H01L 27/14609 |
| | | | | 257/440 |
| 2015/0228687 A1* | 8/2015 | Numata | ............ | H01L 27/14627 |
| | | | | 257/432 |
| 2015/0340445 A1* | 11/2015 | Choi | ...................... | H01L 29/36 |
| | | | | 257/292 |
| 2017/0092670 A1* | 3/2017 | Okamoto | ......... | H01L 27/14603 |

FOREIGN PATENT DOCUMENTS

| | | |
|---|---|---|
| JP | 2016-076647 A | 5/2016 |
| JP | 2016-092035 A | 5/2016 |

\* cited by examiner

IMAGE LAG ELECTRON OUTPUT WAVEFORM vs TRAP LEVEL

PHOTOELECTRIC CONVERSION DEVICE AND IMAGING SYSTEM

BACKGROUND OF THE INVENTION

Field of the Invention

The present disclosure relates to a photoelectric conversion device.

Description of the Related Art

Recently, there has been a demand for high-speed, high-resolution image processing. When a video image of fast-moving subjects is converted into electrical signals, or when a strong light ray impinges on a specific pixel, charge carriers remain in the photoelectric conversion portion as a residual signal and are undesirably output as image lag, thus degrading image quality.

Japanese Patent Laid-Open No. 2007-251074 discloses that image lag in CMOS image sensors depends on the oxygen concentration in the silicon substrate.

If the oxygen concentration in the silicon substrate is reduced, white spots or the like are likely to be caused by dislocations, and image quality is not necessarily improved even if image lag is reduced.

SUMMARY OF THE INVENTION

The present disclosure provides a photoelectric conversion device that can achieve high image quality by reducing both white spots and image lag.

According to an aspect of the present disclosure, there is provided a photoelectric conversion device including a photoelectric conversion portion in a silicon layer having a light-receiving surface and capable of producing electrons as signal charge carriers from light that has entered through the light-receiving surface. The silicon layer includes an N-type first impurity region, and a P-type second impurity region disposed opposite the light-receiving surface in a direction perpendicular to the light-receiving surface with respect to the first impurity region and containing boron and oxygen. The photoelectric conversion portion includes at least a part of the first impurity region and at least a part of the second impurity region. The second impurity region includes a first portion having an atomic boron concentration Ba that is the highest of the portions opposite the light-receiving surface with respect to the first impurity region and an atomic oxygen concentration Oa, and a second portion located opposite the first impurity region in the direction perpendicular to the light-receiving surface with respect to the first portion and having an atomic boron concentration Bb and an atomic oxygen concentration Ob. The second impurity region satisfies the relationship $Ba \times Oa^2 < Bb \times Ob^2$.

According to another aspect of the present disclosure, there is provided a photoelectric conversion device including a photoelectric conversion portion in a silicon layer having a light-receiving surface and capable of producing electrons as signal charge carriers from light that has entered through the light-receiving surface. The silicon layer includes an N-type first impurity region, and a P-type second impurity region disposed opposite the light-receiving surface in a direction perpendicular to the light-receiving surface with respect to the first impurity region and containing boron and oxygen. The photoelectric conversion portion includes at least a part of the first impurity region and at least a part of the second impurity region. The second impurity region includes a first portion having an atomic boron concentration that is the highest of the portions opposite the light-receiving surface with respect to the first impurity region, a second portion opposite the first impurity region in the direction perpendicular to the light-receiving surface with respect to the first portion, and a third portion located on the same side as the first impurity region in the direction perpendicular to the light-receiving surface with respect to the first portion and having an atomic boron concentration Bc and an atomic oxygen concentration Oc. The third portion satisfies the relationship $1 \times 10^{46} \leq Bc \times Oc^2 \leq 1 \times 10^{50}$.

Further features of the present disclosure will become apparent from the following description of exemplary embodiments with reference to the attached drawings.

DESCRIPTION OF THE EMBODIMENTS

Figure 1A:
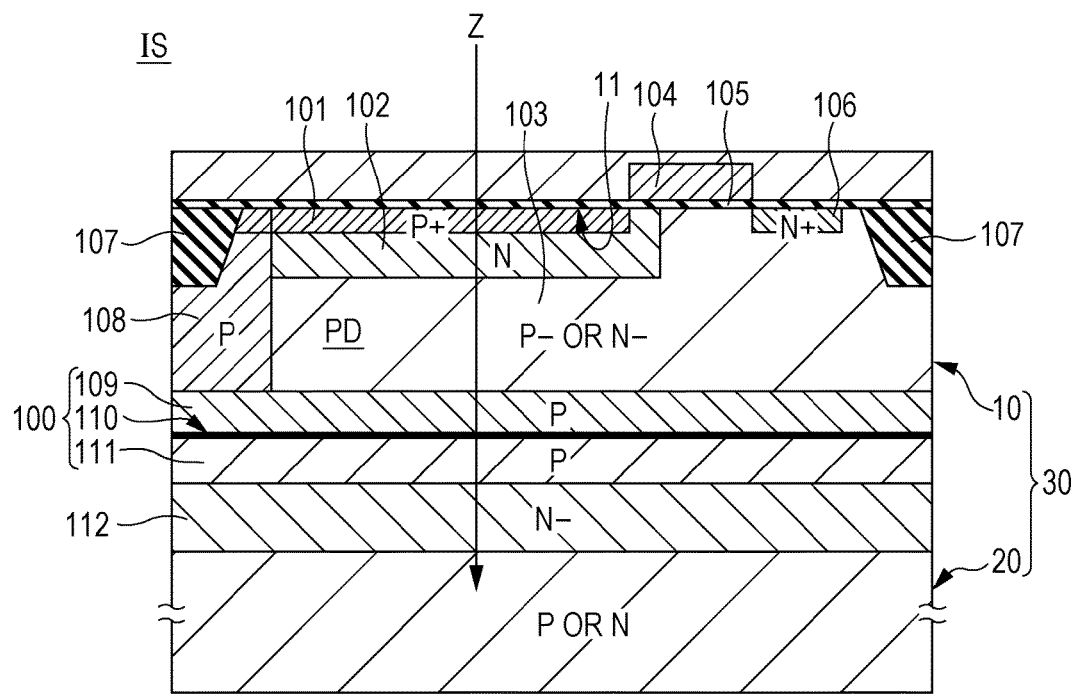
FIGS. 1A and 1B are schematic diagrams of a photoelectric conversion device.

An embodiment of the present concept will now be described with reference to the drawings. In the following description and the drawings, the same reference numerals refer to the same parts throughout the drawings. The description of the same parts designated by the same reference numerals throughout the drawings may be omitted.

FIG. 1A illustrates a cross section of the photoelectric conversion portion PD of a photoelectric conversion device IS.

The photoelectric conversion device IS includes a silicon layer 10. The silicon layer 10 is disposed on a base 20. The silicon layer 10 may be a monocrystalline silicon layer (epitaxial layer) epitaxially grown on the base 20. Since the base 20 is made of monocrystalline silicon, the silicon layer 10 and the base 20 are collectively referred to as a silicon substrate 30. The silicon layer 10 has a thickness of, for example, 5 μm to 20 μm, and the base 20 has a thickness of, for example, 20 μm to 8000 μm.

The silicon layer 10 has a light-receiving surface 11 at the surface thereof. The photoelectric conversion portion PD produces electrons as signal charge carriers from light that has entered through the light-receiving surface 11. A direction perpendicular to the light-receiving surface 11 is hereinafter referred to as a depth direction Z.

The silicon layer 10 includes an impurity region 100, a surface region 101, a charge accumulation region 102, a photoelectric conversion region 103, and a charge discharge region 112. The silicon layer 10 shown in FIG. 1A includes, in the depth direction Z, a surface region 101, a charge discharge region 112, and other semiconductor regions between the surface region 101 and the charge discharge region 112. The impurity region 100 is a P-type semiconductor region in the silicon layer 10. A P-type or an N-type impurity region refers to a semiconductor region whose conductivity type, P-type or N-type, depends on the net concentrations of the acceptor and the donor. The P-type impurity region 100 forms a potential well for electrons acting as signal charge carriers of the photoelectric conversion portion PD. The charge accumulation region 102 is an N-type impurity region in the silicon layer 10 and is disposed between the light-receiving surface 11 and the P-type impurity region 100 in the depth direction Z. The charge accumulation region 102 accumulates electrons produced in the photoelectric conversion portion PD by photoelectric conversion. In the silicon layer 10, the impurity region 100 is disposed opposite the light-receiving surface 11 with respect to the charge accumulation region 102. The surface region 101 is a P-type impurity region disposed between the light-receiving surface 11 and the charge accumulation region 102. The surface region 101 acts as a pinning region that separates electrons or signal charge carriers from the light-receiving surface 11. The photoelectric conversion region 103 is a P-type or an N-type impurity region disposed between the charge accumulation region 102 and the impurity region 100 in the depth direction Z. The electrons converted from light in the photoelectric conversion region 103 migrate to the charge accumulation region 102 along the potential gradient, thus being accumulated in the charge accumulation region 102. The charge discharge region 112 is an N-type impurity region disposed opposite the charge accumulation region 102 with respect to the impurity region 100 in the depth direction Z. The charge discharge region 112 may be in contact with the base 20.

The photoelectric conversion portion PD includes at least a part of the impurity region 100 and at least a part of the charge accumulation region 102. The photoelectric conversion portion PD includes also at least a part of the photoelectric conversion region 103. At least a part of the surface region 101 may function as the photoelectric conversion portion PD.

A transfer gate electrode 104 is disposed on the silicon layer 10 with a gate insulating layer 105 therebetween. Electrons accumulated in the charge accumulation region 102 are transferred to a floating diffusion region 106 that is an N-type impurity region through a channel defined by the transfer gate electrode 104. A potential corresponding to the amount of charge in the floating diffusion region 106 is input to the gate of an amplifying transistor (not shown). The amplifying transistor forms a source follower circuit and outputs a signal according to the amount of charge in the floating diffusion region 106 to an output line.

The photoelectric conversion device IS has a plurality of photoelectric conversion portions PD separated from each other by insulating isolation portions 107 having an STI (shallow trench isolation) structure or a LOCOS (local oxidation of silicon) structure and/or semiconductor isolation portions 108 based on P-N junction isolation. The light-receiving surface 11 is covered with an insulating film, such as the gate insulating layer 105 or an interlayer insulating film. The interlayer insulating film is provided thereon with a multilayer structure or an optical structure, such as color filters and microlenses (not shown).

Figure 1B:
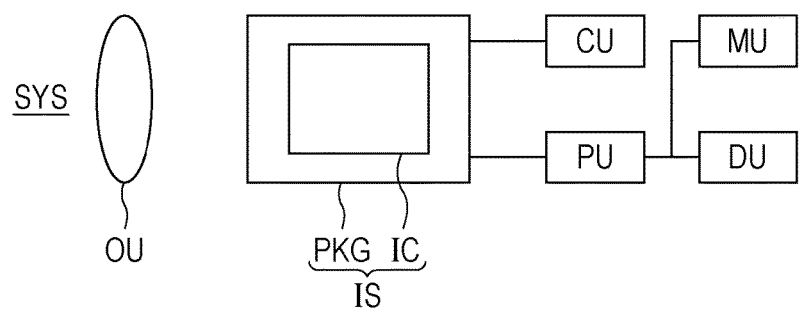

A configuration of the photoelectric conversion device IS will now be described with reference to FIG. 1B. FIG. 1B illustrates an exemplary configuration of an imaging system SYS including the photoelectric conversion device IS. The imaging system SYS acts as an information terminal including a camera or any other photographing function. The photoelectric conversion device IS includes a semiconductor device IC including the silicon substrate 30, and may further include a package PKG containing a semiconductor device IC. The package PKG may include a base to which the semiconductor device IC is fixed, a lid made of, for example, glass and opposing the semiconductor substrate, and a connecting member, such as a bonding wire or a bump, connecting the terminal on the base to the terminal of the semiconductor device IC.

The imaging system SYS includes at least one of an optical unit, a control unit CU, a processing unit PU, a display unit DU, and a memory unit MU. The optical unit OU forms an image on the photoelectric conversion device IS. The control unit CU controls the photoelectric conversion device IS. The processing unit PU processes signals output from the photoelectric conversion device IS. The display unit DU displays images formed in the photoelectric conversion device, and the memory unit MU stores the images.

The impurity region 100 contains boron and oxygen. The present inventors examined the mechanism of image lag in the photoelectric conversion device, and found that the concentration of defects that can cause image lag in the photoelectric conversion device is proportional to the product of the square of interstitial oxygen concentration and substitutional boron concentration. The composition of defects causing image lag can be defined by this product. The present disclosure is based on this finding, focusing particularly on impurities in the impurity region 100.

Figure 2:
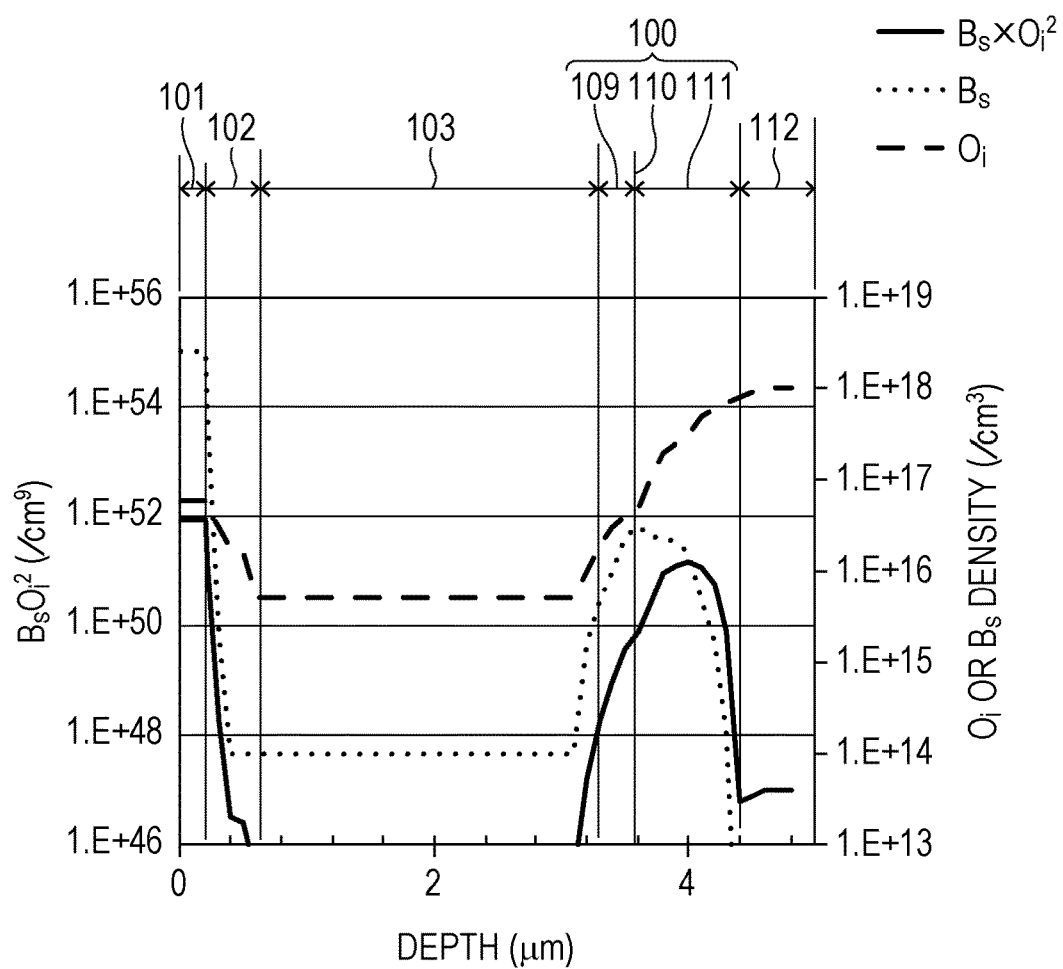
FIG. 2 is a schematic representation of distributions of impurities in a photoelectric conversion device.
Figure 3:
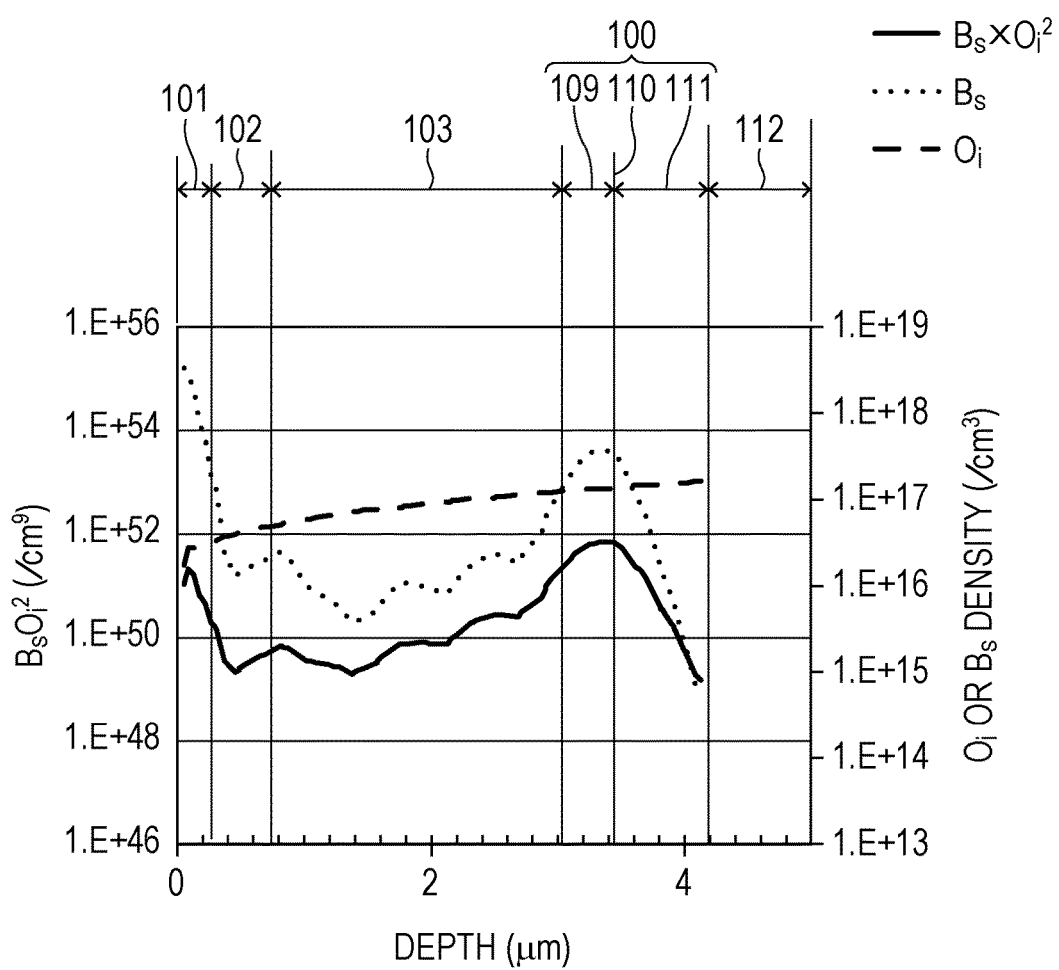
FIG. 3 is a schematic representation of distributions of impurities in a photoelectric conversion device.

FIG. 2 shows the distributions of atomic oxygen concentration Oi (atoms/cm$^3$) and atomic boron concentration Bs (atoms/cm$^3$) in the depth direction Z in a photoelectric conversion device IS of an Example. FIG. 3 shows the distributions of atomic oxygen concentration Oi (atoms/cm$^3$) and atomic boron concentration Bs (atoms/cm$^3$) in the depth direction Z in a photoelectric conversion device IS of a Comparative Example. In FIGS. 2 and 3, although "DENSITY (/cm$^3$)" is shown in vertical axis, "DENSITY (/cm$^3$)" is the same as atomic concentration with unit of measurement of "atoms/cm$^3$" in meaning. The impurity concentration distributions shown in FIGS. 2 and 3 can be obtained by secondary ion mass spectrometry (SIMS) and calculation. In FIGS. 2 and 3, the position at a depth of 0 (μm) corresponds to the light-receiving surface 11. Each region or portion in the depth direction Z corresponds to the SIMS measurement point at the corresponding depth in the depth direction Z. For SIMS measurement, the substrate 30 is etched to a depth immediately before the measurement position from the rear side (opposite the light-receiving surface 11), and the exposed surface at the rear side is subjected to SIMS measurement. This operation enables impurity densities to be accurately measured in the vicinity of the interface of the light-receiving surface 11. SIMS measurement performed from the light-receiving surface 11 results in insufficient accuracy due to the knock-on and mixing phenomenon of primary ions. The resolution of the SIMS measurement at a measurement point in the depth direction depends on how deep the substrate 30 is etched. For reference, 1E+16 or similar representations in the form of mEn (m=1, n=+16) shown in FIGS. 2 and 3 represent m×10n. When m is "1." it means m=1.0 and implies that the number of significant digits is 2.

The impurity region 100 will now be described with reference to FIG. 1A and FIGS. 2 and 3. The impurity region 100 includes a base portion 110 exhibiting the highest boron concentration of the portions of the P-type impurity regions 100 in the depth direction Z. In other words, the base portion 110 has the highest boron concentration of the portions located opposite the light-receiving surface 11 with respect to the charge accumulation region 102. Although the surface region 101 may include a portion having a higher boron concentration than the base portion 110, it does not lie opposite the light-receiving surface 11 with respect to the charge accumulation region 102. Hence, the surface region 101 does not act as the base portion 110. The impurity region 100 also includes a deep portion 111 opposite the charge accumulation region 102 in the depth direction Z with respect to the base portion 110. The impurity region 100 also includes a shallow portion 109 on the same side as the charge accumulation region 102 in the depth direction Z with respect to the base portion 110. According to a potential distribution profile where the base portion 110 has the highest value, photoelectrons produced in the shallow portion 109 are accumulated in the charge accumulation region 102, and the depth portion 111 discharges excess photoelectrons to the charge discharge region 112. Since the shallow portion 109 produces signal charge carriers to be accumulated in the charge accumulation region 102, the shallow portion 109 is a member of the photoelectric conversion portion PD. The depth portion 111 that discharges signal charge carriers is not necessarily included in the photoelectric conversion portion PD.

The shallow portion 109 and the deep portion 111 have lower boron densities than the base portion 110. Since the base portion 110 has the highest boron concentration, the thickness, or width in the depth direction, of the base portion 110 is so small that the shallow portion 109 and the deep portion 111 are observed as if they were in contact with each other. Accordingly, the base portion 110 is designated by a line in FIGS. 2 and 3. The base portion 110, however, may have the highest boron concentration across a certain width in the depth direction Z in some cases. In this instance, the shallow portion 109 and the deep portion 111 are separated by the base portion 110.

In the Example, the photoelectric conversion region 103 is of the N-type, and the width of the region where the shallow portion 109 lies is narrower than that of the region where the deep portion 111 lies. Accordingly, the width of the region, in the depth direction Z, where a P-type semiconductor region lies on the same side as the charge accumulation region 102 with respect to the base portion 110 is narrower than that of the region, in the depth direction Z, where a P-type semiconductor region lies opposite the charge accumulation region 102 with respect to the base portion 110. This structure is advantageous for increasing sensitivity. In the case of the Comparative Example, the photoelectric conversion region 103 is of the P-type, and a P-type semiconductor region extends across the photoelectric conversion region 103 and the shallow portion 109.

Although the base 20 is made of crystalline silicon and may be of the N-type or the P-type, it advantageously has N-type conductivity from the viewpoint of reducing image lag and white spots. The N-type base 20 helps to discharge charge carriers from the charge discharge region 112, and accordingly, structural constraints to the impurity region 100 for discharging charge carriers can be reduced. Consequently, charge carriers are appropriately discharged or accumulated, and the impurity region 100 can be optimized to reduce image lag and white spots.

The atomic oxygen concentration Oi (atoms/cm$^3$) in each portion in the depth direction Z is defined as follows: The atomic oxygen concentration in the base portion 110 is denoted as Oa (atoms/cm$^3$); the atomic oxygen concentration in the deep portion 111 is denoted as Ob (atoms/cm$^3$); the atomic oxygen concentration in the shallow portion 109 is denoted as Oc (atoms/cm$^3$). The atomic oxygen concentration in the surface region 101 is denoted as Od (atoms/cm$^3$).

The atomic boron densities Bs (atoms/cm$^3$) in each portion in the depth direction Z are defined as follows: The atomic boron concentration in the base portion 110 is denoted as Ba (atoms/cm$^3$); the atomic boron concentration in the deep portion 111 is denoted as Bb (atoms/cm$^3$); the atomic boron concentration in the shallow portion 109 is denoted as Bc (atoms/cm$^3$). The atomic boron concentration in the surface region 101 is denoted as Bd (atoms/cm$^3$).

In the regions or portions, such as the deep portion 111, the shallow portion 109, and the surface region 101, having a wider width in the depth direction Z than the resolution in the depth direction of the SIMS measurement, the impurity concentration at a measurement point in the region or portion refers to the impurity concentration of the region or portion. Although it suffices that at least one of the measurement points in a region satisfies the condition of impurity densities described later, it is desirable that all the measurement points satisfy the condition.

FIGS. 2 and 3 show the product Bs×Oi$^2$ of the square of the atomic oxygen concentration Oi and the atomic boron concentration Bs at each portion in the depth direction Z. The product Bs×Oi$^2$ is represented by "/cm$^9$". However, since the unit itself has no significant meaning, the product may be represented without unit (can be represented by any unit). The product Bs×Oi$^2$ of the square of the atomic oxygen concentration Oi and the atomic boron concentration Bs in each portion in the depth direction Z is defined as follows: The product in the base portion 110 is represented by Ba×Oa$^2$; the product in the deep portion 111 is represented by Bb×Ob$^2$; the product in the shallow portion 109 is represented by Bc×Oc$^2$; and the product at the surface region 101 is represented by Bd×Od$^2$.

Figure 4:
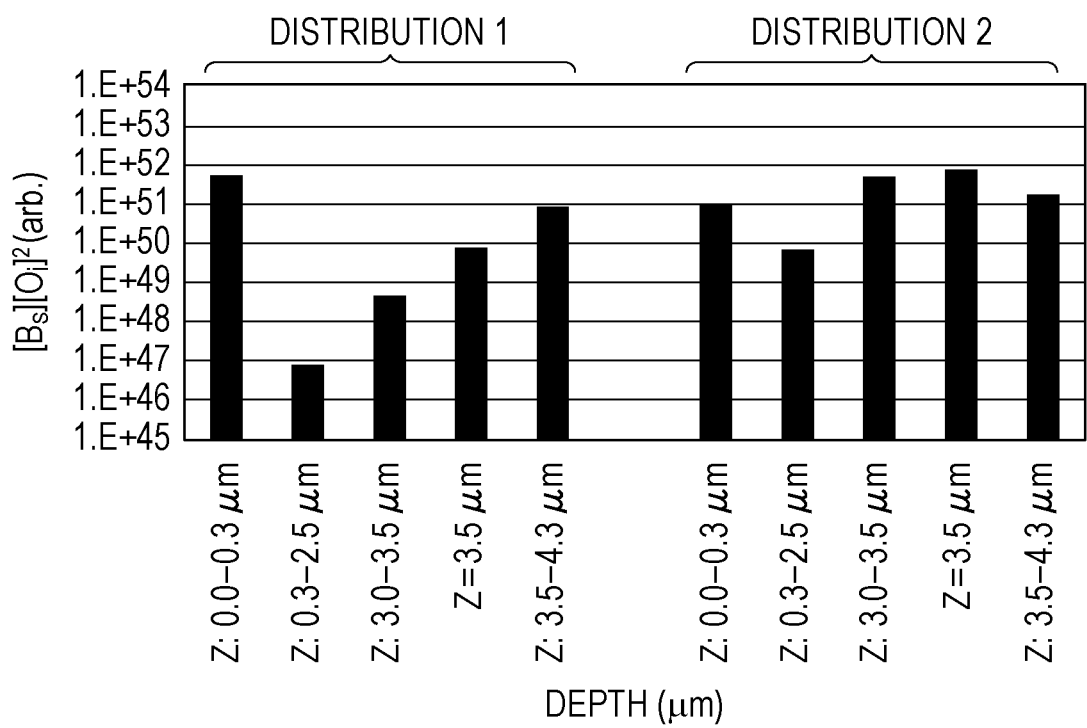
FIG. 4 is a schematic representation of distributions of impurities in a photoelectric conversion device.

FIG. 4 shows the average product Bs×Oi$^2$ in each portion or region in the depth direction Z of the Example (distribution 1) shown in FIG. 2 and the Comparative Example (distribution 2) shown in FIG. 3. In FIG. 4, "Z: 0.0-0.3 μm" corresponds to the surface region 101; "Z: 0.3-2.5 μm" corresponds to the charge accumulation region 102 and the photoelectric conversion region 103. "Z: 3.0-3.5 μm" corresponds to the shallow portion 109; "Z=3.5 μm" corresponds to the base portion 110; and "Z: 3.5-4.3 μm" corresponds to the deep portion 111.

The Example shown in FIG. 2 satisfies the following Relationships (01) to (15). Satisfying at least one of the Relationships (01) to (15) is advantageous for reducing both white spots and image lag that affect photoelectric conversion performance, and for improving the quality of the signals produced in the photoelectric conversion portion PD. Conditions or the like shown in FIGS. 2 and 4 or derived therefrom, but not described in connection with the following relationships are also advantageous for, for example, increasing sensitivity and saturation and reducing white spots, dark current, and image lag, and thus realizing a high-performance photoelectric conversion device, and are part of the present embodiment. The conditions or the like shown in the Example are advantageous for meeting the needs of the industry for photoelectric conversion device, for example, to insure long-term reliability, reduce fluctuations in properties, and increase manufacturing yield.

$$Ba \times Oa^2 < Bb \times Ob^2 \quad (01)$$

$$Ba < Oa \quad (02)$$

$$Bb < Ob \quad (03)$$

$$1\times10^{16} \leq Oa \leq 1\times10^{18} \quad (04)$$

$$1\times10^{46} \leq Ba\times Oa^2 \leq 1\times10^{52} \quad (05)$$

$$Bc\times Oc^2 < Ba\times Oa^2 \quad (06)$$

$$1\times10^{46} \leq Bc\times Oc^2 \leq 1\times10^{50} \quad (07)$$

$$1\times10^{50} < Bb\times Ob^2 \, 1\times10^{52} \quad (08)$$

$$Bc\times Oc^2 < Bd\times Od^2 \quad (09)$$

$$Bb\times Ob^2 < Bd\times Od^2 \quad (10)$$

$$Bc\times Oc^2 < Bb\times Ob^2 \quad (11)$$

$$1\times10^{50} < Bd\times Od^2 \leq 1\times10^{52} \quad (12)$$

$$Od \geq 6\times10^{16} \quad (13)$$

The cause of image lag is that photoelectrons are trapped in a defect in the silicon layer 10 and then released from the defect after a certain delay. The lower the atomic oxygen concentration Oi in the silicon layer 10, the less image lag. In manufacture of CMOS image sensors, the oxygen in the silicon layer 10 functions to suppress the growth of dislocation caused by stress in the manufacturing process and thus to reduce white spots. If a CMOS image sensor is produced under a condition of excessively low oxygen concentration Oi, cracks, slip deformation, or dislocation are likely to be caused by stress of temperature changes during heat treatment in the process or during use and result in white spots.

Figure 5A:
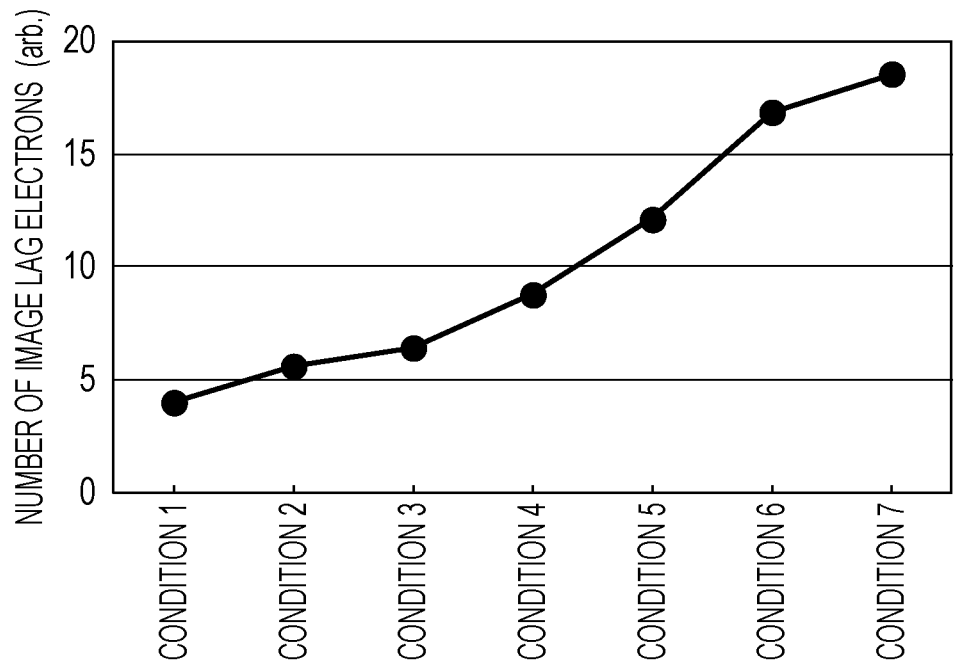
FIGS. 5A and 5B are each a plot of the relationship between impurity concentration and image lag.

FIG. 5A shows the number of image lag electrons under different conditions where the atomic boron concentration Bs and atomic oxygen concentration Oi in the impurity region 100 are varied. The condition of boron concentration Bs is as follows: condition 1<condition 2=condition 3=condition 4=condition 5=condition 6<condition 7. The condition of oxygen concentration Oi is varied as follows: condition 1=condition 2<condition 3<condition 4<condition 5<condition 6=condition 7. The Example shown in FIG. 2 corresponds to condition 1, and the Comparative Example shown in FIG. 3 corresponds to condition 4.

Figure 5B:
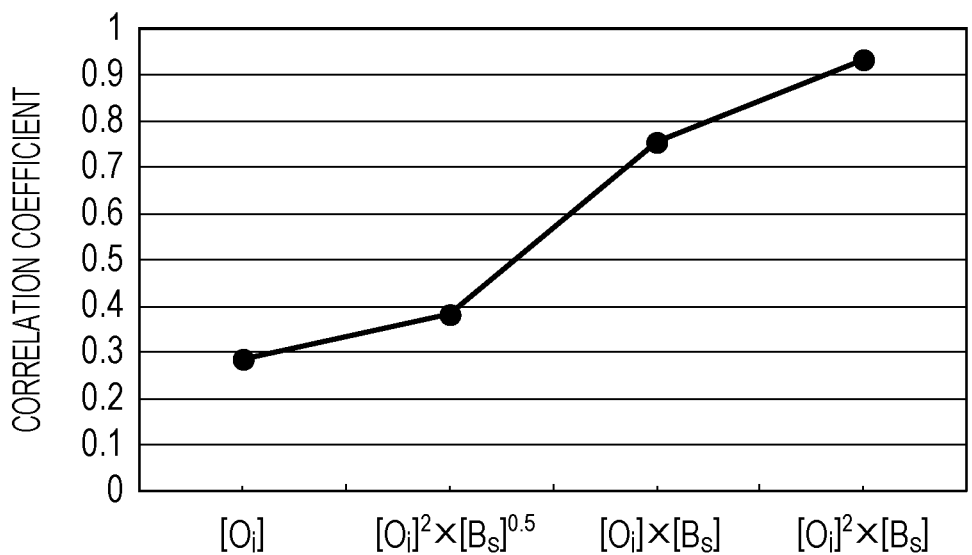

FIG. 5B shows the correlation coefficients of some functions of oxygen concentration Oi and boron concentration Bs between the measured number of image lag electrons and the simulated number of image lag electrons. As shown in FIG. 5B, the correlation coefficient is the highest when the number is proportional to the product $Bs\times Oi^2$ of the square of oxygen concentration Oi and boron concentration Bs. This suggests that the composition of defects can be represented as $[Bs][Oi]^2$.

Also, since the shallow portion 109 has the most defects that can cause image lag, and many electrons likely to be trapped, the number of image lag electrons depends on the shallow portion 109. In order to reduce image lag, it is important to reduce defects in the shallow portion 109. Also, in order to reduce white spots without increasing image lag, it is desirable to increase the oxygen concentration Oi in the surface region 101 and across the region from the deep portion 111 to the deeper charge discharge region 112.

In order to reduce the oxygen concentration Oi in the shallow portion 109 and to increase the oxygen concentration Oi in the deep portion 111, the surface of the base 20 with an oxygen concentration Oi is subjected to epitaxial growth at a low temperature so that the oxygen concentration Oi in the deep portion 111 has a steep gradient. As a result, the oxygen concentration Oi decreases significantly in the base portion 110 having the highest concentration of boron, which forms a potential well or barrier. Thus, the deep portion 111 can have a larger product $Bs\times Oi^2$ of the square of oxygen concentration Oi and boron concentration Bs than the base portion 110 exhibiting the highest boron concentration. This is represented by Relationship (01), leading to an image sensor that cause few white spots or little image lag.

Relationships (02) to (05) and (08) represent practical conditions for ensuring a high sensitivity while satisfying Relationship (01). Relationships (02) and (03) means that the base portion 110 or the deep portion 111 contains oxygen in a significant degree. When the photoelectric conversion region 103 is of the N-type as in the case of the Example, Relationships (02) and (03) are advantageous for reducing image lag and white spots. Relationship (04) means that the oxygen concentration Oi in the base portion 110 or the deep portion 111 needs to be limited so as to reduce oxygen in the shallow portion 109 and the photoelectric conversion region 103. More advantageously, Relationship (04) is represented by $5\times10^{16} \leq Oa \leq 5\times10^{17}$. In the case of the Example, $Oa<1\times10^{17}$ holds true.

The boron concentration in the shallow portion 109 and the deep portion 111 can be controlled by the conditions for ion implantation for forming the impurity region 100. The parameter strongly reflecting the conditions for ion implantation is the boron concentration Ba in the base portion 110 exhibiting the maximum of the boron distribution. Hence, the boron concentration Ba in the base portion 110 can be a parameter characterizing the boron distribution in the impurity region 110. The boron concentration Ba in the base portion 110 satisfies $1\times10^{14} \leq Ba \leq 1\times10^{18}$ and is, in practice, $1\times10^{15} \leq Ba \leq 1\times10^{17}$. In the Example, it is $1\times10^{16}<Ba<1\times10^{17}$.

Satisfying Relationship (06) and/or Relationship (07) is a requirement for the shallow portion 109 of the photoelectric conversion portion PD. These are advantageous for reducing white spots and image lag while ensuring the sensitivity of the photoelectric conversion portion PD.

Since the deep portion 111 is located outside the barrier of the electron potential well of the photodiode, electrons trapped in defects will be discharged without being read as image signals, and do not much influence image lag.

Since the oxygen concentration Oi in the deep portion 111 and the charge discharge region 112 determines the resistance to stress of the silicon layer 10 in a bulk state, the resistance to slip deformation or cracks is increased by keeping the oxygen concentration Oi high in the deep portion 111 and the charge discharge region 112.

As represented in Relationships (09), (10), and (11), the product $Bs\times Oi^2$ of the square of oxygen concentration Oi and boron concentration Bs increases in this order: photoelectric conversion region 103<shallow portion 109<deep portion 111<surface region 101. This has a technical significance in minimizing oxygen concentration Oi and boron concentration Bs. From the viewpoint of the resistance to stress, oxygen concentration Oi is important in the surface region 101 acting as a surface layer isolation region, and the deep portion 111, and is not important in the charge accumulation region 102 and the photoelectric conversion region 103. From the viewpoint of reducing white spots, it is desirable that oxygen concentration be low in the charge accumulation region 102, the photoelectric conversion region 103, and the shallow portion 109. In contrast, from the viewpoint of reducing white spots, these regions or portions need to have the highest boron concentration Bs for forming a surface pinning layer of the surface region 101.

The region having the highest boron concentration next to the boron concentration in the surface region 101 is the portion (base portion 110) having the highest value necessary to form the bottom of the potential well and located between the shallow portion 109 and the deep portion 111, from the viewpoint of ensuring a sensitivity. When the product $Bs \times Oi^2$ of the square of oxygen concentration Oi and boron concentration Bs increases in this order: photoelectric conversion region 103<shallow portion 109<deep portion 111<surface region 101, oxygen concentration Oi and boron concentration Bs are satisfactorily optimized. This optimization reduces white spots and image lag and ensures a high sensitivity.

When the product of the square of the oxygen concentration Oi and the boron concentration Bs in the surface region 101 is $1 \times 10^{52}$ atoms$^3$/cm$^9$ or less as represented by Relationship (12), image lag is reduced. Also, the boron concentration Bs in the surface region 101 is $2 \times 10^{18}$/cm$^3$ or more from the viewpoint of pinning the energy level of the silicon interface.

From the viewpoint of increasing the resistance to stress of the surface region 101 at the vicinity of the insulating isolation portion 107, the oxygen concentration Oi in the surface region 101 is increased to $6 \times 10^{16}$/cm$^3$ or more by ion implantation as represented by Relationship (13). Hence, the oxygen concentration Oi in the surface region 101 is $6 \times 10^{16}$ atoms/cm$^3$ or more. Thus, dislocation in the surface layer is reduced, and white plots are reduced accordingly.

The deep portion 111 is a region most likely to suffer from defects when the shallow portion 109 and the deep portion 111 are doped with boron by high-speed ion implantation, and is likely to be the starting point from which dislocation occurs. If a dislocation that has occurred in the deep portion grows and extends to the shallow portion 109, then to the photoelectric conversion region 103, and further to the charge accumulation region 102 by heat treatment in a subsequent process step or changes in thermal conditions during use, white spots occur. Therefore, by increasing the oxygen concentration Oi in the deep portion 111, white spots can be reduced.

The product of the square of the oxygen concentration Oi and the boron concentration Bs in the surface region 101 is $1 \times 10^{52}$ atoms$^3$/cm$^9$ or less. The product of the square of the oxygen concentration Bi and the boron concentration Bs in the surface region 101 can be higher than that in the shallow portion 109 by two digits due to an influence of electron concentration. In other words, a small variation in product $Bs \times Oi^2$ in the impurity region 100 strongly influences image lag. In particular, the condition of setting the product $Bs \times Oi^2$ to $1 \times 10^{50}$ or less in the shallow portion 109 implies that there occurs a significant difference in reducing image lag if the product exceeds $1 \times 10^{50}$. For example, varying the product $Bs \times Oi^2$ by one digit means that a notable difference can be produced in reducing image lag.

The Comparative Example is different from the Example. Particularly in the Comparative Example, defects that can cause image lag have a peak concentration at the position where the shallow portion 109 and the deep portion 111 come into contact with each other, that is, the position having a peak boron concentration. On the other hand, in the Example, defects that can cause image lag have a peak concentration at the position where the shallow portion 109 and the deep portion 111 come into contact with each other, that is, a position deeper than the position having a peak boron concentration.

The relationship between the distribution of defects that can cause image lag and the trapping of photoelectrons in the defects will now be considered. The shallow portion 109 contains a larger amount of oxygen diffused from the base 20 by a thermal step in the manufacturing process, and has many defects that can cause image lag due to the presence of a large amount of boron ion-implanted for forming a barrier of a potential well.

On the other hand, the surface region 101 has a lower concentration Oi of oxygen diffused from the substrate 20, but has a high boron concentration Bs, consequently having a measurable defect concentration. However, a potential gradient given by the contact of the charge accumulation region 102 with the surface region 101 keeps the photoelectron concentration in the surface region 101 low. Accordingly, even if the surface region 101 has defects, the probability of trapping is low, and the defects do not much influence image lag.

Thus, electrons are discharged along the potential gradient even if the resistance to stress is increased by increasing the oxygen concentration Oi in the surface region 101 to prevent dislocation in a step of isolating elements. Accordingly, the risk of increasing image lag is reduced.

Since the photoelectric conversion region 103 has a low oxygen concentration Oi and a low boron concentration Bs, it does not much influence image lag. In the charge accumulation region 102, the boron concentration Bs is set low, and the oxygen concentration Oi is also low. The influence of the charge accumulation region 102 on image lag is therefore still smaller than that of the photoelectric conversion portion 103.

As described above, in the photoelectric conversion device IS of the present embodiment, the product $Bs \times Oi^2$ of the square of the oxygen concentration Oi and the boron concentration Bs in the deep portion 111 is larger than that in the base portion 110. Also, the product $Bs \times Oi^2$ of the square of the oxygen concentration Oi and the boron concentration Bs in the photoelectric conversion device IS is $1 \times 10^{52}$ or less.

The relationship between image lag and $[Bs][Oi]^2$ will now be described in detail. The present inventors fit measured image lag data with 3D simulation data obtained by calibrating SIMS measurement data of boron concentration distribution and oxygen concentration distribution. The concentration of defects that can cause image lag in a CMOS image sensor is proportional to the product of the square of interstitial oxygen concentration Oi and substitutional boron concentration Bs. In view of the temperature dependence of image lag, the energy level of defects is $Et-Ev=0.5$ eV$\pm 0.1$ eV, and the electron trapping cross section $\sigma n$ is about $10^{-15}$ cm$^2$.

Figure 6A:
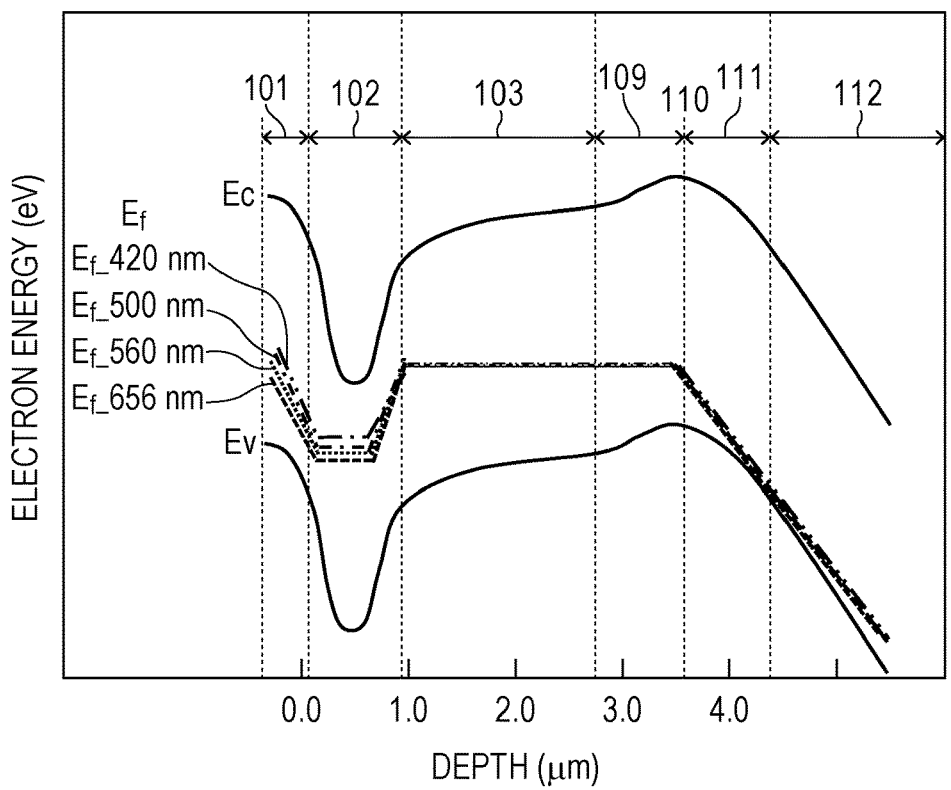
FIGS. 6A and 6B are each a schematic representation of the relationship between impurity distribution and electrons in a photoelectric conversion device.
Figure 6B:
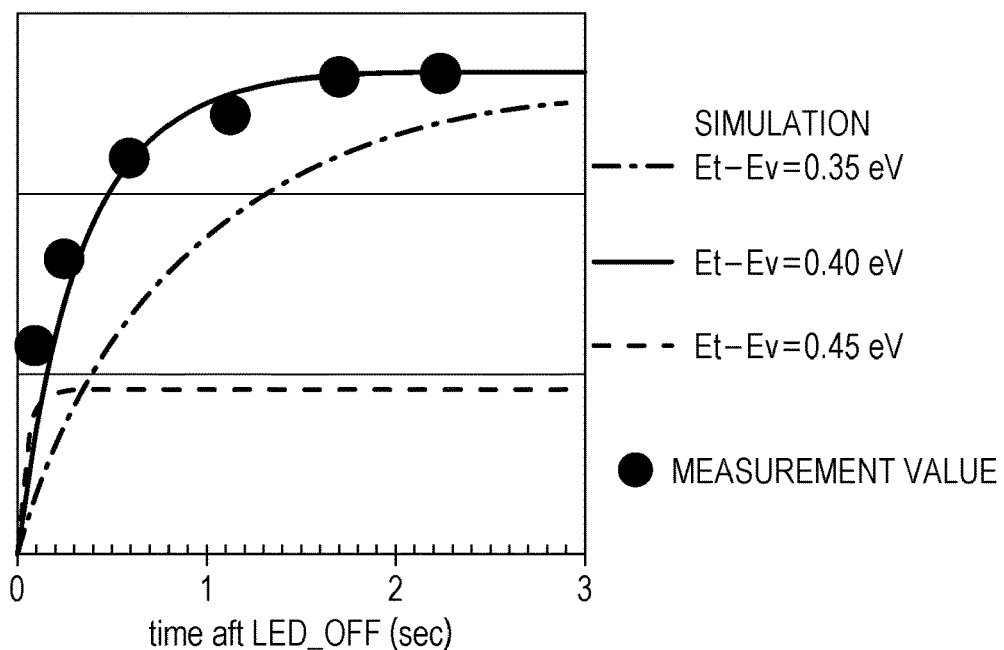

The present inventors measured light intensity providing the same number of image lag electrons by irradiating the light-receiving surface 11 with light rays having different wavelengths, and simulated for each wavelength the rate of photoelectron generation in the silicon layer 10 and the distribution of electron Fermi level in the depth direction in the silicon layer 10. FIGS. 6A and 6B show the results. In FIG. 6A, the difference [Ef−Ev] between the Fermi level Ef of photoelectrons when light has entered and the energy Ev of valence band is a parameter representing electron concentration. The distribution of the difference [Ef−Ev] in the depth direction is largest in the charge accumulation region 102 and is second largest in the photoelectric conversion region 103 and the shallow portion 109. Compared to these regions or portions, the surface region 101 does not accumulate electrons due to the potential gradient and is not likely to have a high electron concentration. Therefore, [Ef−Ev] in the surface region 101 is small, suggesting that the surface region is unlikely to trap electrons. These results suggest that the shallow portion 109 has the most defects that can cause image lag and many electrons likely to be trapped and is, accordingly, the region that determines the number of image lag electrons.

The rate of photoelectron generation depends largely on wavelength of light, and decreases exponentially in the depth direction Z in the silicon layer 10. For example, the rate of photoelectron generation is $1.00 \times 10^{17}$ (cm$^{-3}$/s) in the charge accumulation region 102. It decreases toward the impurity region 100 at approximately equal intervals to $1.00 \times 10^{16}$ (cm$^{-3}$/sec), $1.00 \times 10^{15}$ (cm$^{-3}$/sec), and the like. However, when light lays having different wavelengths, capable of providing the same image lag output enters, the photoelectric conversion region 103 and the shallow portion 109 in the photoelectric conversion portion PD exhibit the same Fermi level. Therefore, it is assumed that the mechanism of image lag is as below. Photoelectrons produced from light that has entered the silicon layer 10 diffuses in the silicon layer 10. The probability that the diffused photoelectrons will be trapped is determined according to the relative difference between the energy level of defects that can cause image lag and the Fermi level of the photoelectrons. Then, after light is removed, the trapped electrons are released from the defect level to the conduction level.

As shown in FIG. 5A, image lag depends not only on oxygen concentration Oi, but also on boron concentration Bs. In order to determine the composition of defects that can cause image lag and the energy level of such defects, distributions of the concentration of defects that can cause image lag were formed as some functions of oxygen concentration Oi and boron concentration Bs by 3D process simulation. Then, electrons are trapped in defects by 3D device simulation at light incidence with those functions, and released image lag electrons were calculated by device simulation with light removed.

Also, the defect level Et–Ev was calculated by simulation and determined by fitting the simulation results into image lag measurement data in a level experiment. The comparison of the calculation data of simulation with the level experiment data, shown in FIG. 6B, shows the energy level of defects is Et–Ev=0.5 eV±0.1 eV.

Accordingly, it is assumed that image lag observed in the CMOS image sensor results from complex defects of interstitial oxygen atoms diffused from the base 20 and substitutional boron atoms. Probably, electrons are trapped with increasing electron Fermi level, and are then, after removing light, released with a time constant according to the energy level of defects based on Shockley-Read-Hall process, or SRH model.

According to the above-described considerations, a composition [Bs][Oi]$^2$ can be derived as the composition of defects from the correlation between the measured values and the simulation data of the number of image lag electrons shown in FIG. 5B. The above-described embodiment based on this concept provides a photoelectric conversion device that can achieve high image quality.

The above-described embodiment may be modified without departing from the spirit of the disclosed concept. For example, while the Example has described a surface-irradiated CMOS image sensor, the disclosed concept may be incorporated into a rear-side-irradiated CMOS image sensor or a CCD image sensor.

The present disclosure provides a photoelectric conversion device that can achieve high image quality by reducing both white spots and image lag.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-167346 filed Aug. 29, 2016, which is hereby incorporated by reference herein in its entirety.

What is claimed is:

1. A photoelectric conversion device comprising:
a photoelectric conversion portion in a silicon layer having a light-receiving surface, the photoelectric conversion portion being capable of producing electrons as signal charge carriers from light that has entered through the light-receiving surface,
wherein the silicon layer includes an N-type first impurity region, a P-type second impurity region disposed opposite the light-receiving surface in a direction perpendicular to the light-receiving surface with respect to the first impurity region and containing boron and oxygen, and an N-type impurity region opposite the first impurity region in the direction perpendicular to the light-receiving surface with respect to the second impurity region, and the photoelectric conversion portion includes at least a part of the first impurity region and at least a part of the second impurity region, and
wherein the second impurity region includes a first portion having an atomic boron concentration Ba that is the highest of the portions opposite the light-receiving surface with respect to the first impurity region and an atomic oxygen concentration Oa, and a second portion located opposite the first impurity region in the direction perpendicular to the light-receiving surface with respect to the first portion and having an atomic boron concentration Bb and an atomic oxygen concentration Ob, the second impurity region satisfying the relationship $$Ba \times Oa^2 < Bb \times Ob^2.$$

2. The photoelectric conversion device according the claim 1, wherein the second impurity region satisfies the relationship Ba<Oa.

3. The photoelectric conversion device according to claim 1, wherein the second impurity region satisfies the relationship Bb<Ob.

4. The photoelectric conversion device according to claim 1, wherein the second impurity region satisfies the relationship $1 \times 10^{16} \leq Oa \leq 1 \times 10^{18}$.

5. The photoelectric conversion device according to claim 1, wherein the second impurity region satisfies the relationship $1 \times 10^{46} \leq Ba \times Oa^2 \leq 1 \times 10^{52}$.

6. The photoelectric conversion device according to claim 1, wherein the second impurity region further includes a third portion located on the same side as the first impurity region in the direction perpendicular to the light-receiving surface with respect to the first portion and having an atomic boron concentration Bc and an atomic oxygen concentration Oc, the second impurity region satisfying the relationship $Bc \times Oc^2 < Ba \times Oa^2$.

7. The photoelectric conversion device according to claim 1, wherein the second impurity region further includes a third portion located on the same side as the first impurity region in the direction perpendicular to the light-receiving surface with respect to the first portion and having an atomic boron concentration Bc and an atomic oxygen concentration Oc, the second impurity region satisfying the relationship $1\times10^{46}\leq Bc\times Oc^2\leq 1\times10^{50}$.

8. The photoelectric conversion device according to claim 1, wherein the width of a region, in the direction perpendicular to the light-receiving surface, where a P-type semiconductor region is present on the same side as the first impurity region with respect to the first portion is narrower than the width of a region, in the direction perpendicular to the light-receiving surface, where a P-type semiconductor region is present opposite the first impurity region with respect to the first portion.

9. An imaging system comprising:
the photoelectric conversion device as set forth in claim 1; and
at least one unit selected from the group consisting of an optical unit capable of forming an image on the photoelectric conversion device, a control unit capable of controlling the photoelectric conversion device, a processing unit capable of processing signals output from the photoelectric conversion device, a display unit on which an image formed by the photoelectric conversion device is displayed, and a memory unit in which an image formed by the photoelectric conversion device is stored.

10. A photoelectric conversion device comprising:
a photoelectric conversion portion in a silicon layer having a light-receiving surface, the photoelectric conversion portion capable of producing electrons as signal charge carriers from light that has entered through the light-receiving surface,
wherein the silicon layer includes an N-type first impurity region, a P-type second impurity region disposed opposite the light-receiving surface in a direction perpendicular to the light-receiving surface with respect to the first impurity region and containing boron and oxygen, and an N-type impurity region opposite the first impurity region in the direction perpendicular to the light-receiving surface with respect to the second impurity region, and the photoelectric conversion portion includes at least a part of the first impurity region and at least part of the second impurity region, and
wherein the second impurity region includes a first portion having an atomic boron concentration that is the highest of the portions opposite the light-receiving surface with respect to the first impurity region, a second portion opposite the first impurity region in the direction perpendicular to the light-receiving surface with respect to the first portion, and a third portion located on the same side as the first impurity region in the direction perpendicular to the light-receiving surface with respect to the first portion and having an atomic boron concentration Bc and an atomic oxygen concentration Oc, the third portion satisfying the relationship $1\times10^{46}\leq Bc\times Oc^2\leq 1\times10^{50}$.

11. The photoelectric conversion device according to claim 10, wherein the second portion has an atomic boron concentration Bb and an atomic oxygen concentration Ob, and satisfies the relationship $1\times10^{50}<Bb\times Ob^2\leq 1\times10^{52}$.

12. The photoelectric conversion device according to claim 10, wherein the silicon layer further includes a P-type third impurity region disposed between the light-receiving surface and the first impurity region and containing boron with an atomic concentration Bd and oxygen with an atomic concentration of Od, the silicon layer satisfying the relationship $Bc\times Oc^2<Bd\times Od^2$.

13. The photoelectric conversion device according to claim 10, wherein the silicon layer further includes a P-type third impurity region disposed between the light-receiving surface and the first impurity region and containing boron with an atomic concentration Bd and oxygen with an atomic concentration Od, and the second portion has an atomic boron concentration Bb and an atomic oxygen concentration Ob, and wherein the silicon layer satisfies the relationship $Bb\times Ob^2<Bd\times Od^2$.

14. The photoelectric conversion device according to claim 10, wherein the second portion has an atomic boron concentration Bb and an atomic oxygen concentration Ob, and the second impurity region satisfies the relationship $Bc\times Oc^2<Bb\times Ob^2$.

15. The photoelectric conversion device according to claim 10, wherein the silicon layer further includes a P-type third impurity region disposed between the light-receiving surface and the first impurity region and containing boron with an atomic concentration Bd and oxygen with an atomic concentration Od, and the third impurity region satisfies the relationship $1\times10^{50}<Bd\times Od^2\leq 1\times10^{52}$.

16. The photoelectric conversion device according to claim 10, wherein the silicon layer further includes a P-type third impurity region disposed between the light-receiving surface and the first impurity region and containing boron with an atomic concentration Bd and oxygen with an atomic concentration Od, wherein the third impurity region satisfies the relationship $Od\geq 6\times10^{16}$.

17. The photoelectric conversion device according to claim 10, wherein the width of a region, in the direction perpendicular to the light-receiving surface, where a P-type semiconductor region is present on the same side as the first impurity region with respect to the first portion is narrower than the width of a region, in the direction perpendicular to the light-receiving surface, where a P-type semiconductor region is present opposite the first impurity region with respect to the first portion.

18. An imaging system comprising:
the photoelectric conversion device as set forth in claim 10; and
at least one unit selected from the group consisting of an optical unit capable of forming an image on the photoelectric conversion device, a control unit capable of controlling the photoelectric conversion device, a processing unit capable of processing signals output from the photoelectric conversion device, a display unit on which an image formed by the photoelectric conversion device is displayed, and a memory unit in which an image formed by the photoelectric conversion device is stored.

* * * * *